(12) United States Patent
Li

(10) Patent No.: US 11,974,034 B2
(45) Date of Patent: Apr. 30, 2024

(54) DISPLAY SCREEN, TERMINAL DEVICE AND IMAGING CONTROL METHOD FOR UNDER-SCREEN CAMERA

(71) Applicants: BEIJING XIAOMI MOBILE SOFTWARE CO., LTD. NANJING BRANCH, Jiangsu (CN); BEIJING XIAOMI MOBILE SOFTWARE CO., LTD., Beijing (CN)

(72) Inventor: Hongpeng Li, Beijing (CN)

(73) Assignees: BEIJING XIAOMI MOBILE SOFTWARE CO., LTD. NANJING BRANCH, Jiangsu (CN); BEIJING XIAOMI MOBILE SOFTWARE CO., LTD., Beijing (CN)

( * ) Notice: Subject to any disclaimer, the term of this patent is extended or adjusted under 35 U.S.C. 154(b) by 365 days.

(21) Appl. No.: 17/281,941

(22) PCT Filed: May 21, 2020

(86) PCT No.: PCT/CN2020/091663
§ 371 (c)(1),
(2) Date: Mar. 31, 2021

(87) PCT Pub. No.: WO2021/232378
PCT Pub. Date: Nov. 25, 2021

(65) Prior Publication Data
US 2022/0191362 A1 Jun. 16, 2022

(51) Int. Cl.
*H04N 23/55* (2023.01)
*G02B 27/42* (2006.01)
(Continued)

(52) U.S. Cl.
CPC ......... *H04N 23/55* (2023.01); *G02B 27/4216* (2013.01); *H04M 1/0266* (2013.01);
(Continued)

(58) Field of Classification Search
CPC ........ H04N 23/55; H04N 23/57; H04N 23/62; G02B 27/4216; G02B 27/4205;
(Continued)

(56) References Cited

U.S. PATENT DOCUMENTS

2019/0041656 A1* 2/2019 Ahmed ............... G02B 27/42
2019/0286259 A1* 9/2019 Lin .................. H10K 59/12
2020/0409163 A1* 12/2020 Zhu .................. G02B 5/1866

FOREIGN PATENT DOCUMENTS

CN 109143607 A 1/2019
CN 110244482 A 9/2019
(Continued)

OTHER PUBLICATIONS

International Search Report of PCT/CN2020/091663 dated Feb. 22, 2021 with English translation, (4p).
Extended European Search Report of European Patent Application No. 208535880.0, dated Feb. 3, 2022, (9p).
Zhou, Yuqian, et al., "Image Restoration for Under-Display Camera" published on Mar. 10, 2020, (17p).
(Continued)

*Primary Examiner* — Albert H Cutler
(74) *Attorney, Agent, or Firm* — Arch & Lake LLP

(57) ABSTRACT

A display screen, a terminal device, and an imaging control method are provided for an under-screen camera. The display screen includes a transparent substrate and a diffraction compensation pattern. The upper surface of the transparent substrate comprises a luminescent material. The diffraction compensation pattern is disposed below the transparent substrate and configured to compensate a diffraction image resulted from incident light passing through the luminescent material.

12 Claims, 2 Drawing Sheets

(51) Int. Cl.
*H04M 1/02* (2006.01)
*H04N 23/57* (2023.01)
*H04N 23/62* (2023.01)
*H10K 50/86* (2023.01)
*H10K 59/12* (2023.01)
*H10K 59/65* (2023.01)

(52) U.S. Cl.
CPC .............. *H04N 23/57* (2023.01); *H04N 23/62* (2023.01); *H10K 50/86* (2023.02); *H10K 59/12* (2023.02); *H10K 59/65* (2023.02); *H04M 2201/38* (2013.01)

(58) Field of Classification Search
CPC .............. G02B 13/001; H04M 1/0266; H04M 2201/38; H10K 50/86; H10K 59/12; H10K 59/65; G03B 30/00; G09G 2360/14
See application file for complete search history.

(56) References Cited

FOREIGN PATENT DOCUMENTS

| | | |
|---|---|---|
| CN | 110911438 A | 3/2020 |
| CN | 111180493 A | 5/2020 |
| JP | 2008129136 A | 6/2008 |
| WO | 2018205619 A1 | 11/2018 |
| WO | 2019130934 A1 | 7/2019 |
| WO | 2020057204 A1 | 3/2020 |
| WO | 2020057205 A1 | 3/2020 |

OTHER PUBLICATIONS

Extended European Search Report of European Patent Application No. 208535880.0, dated Mar. 2, 2022, (9p).
The first office action issued in European Application No. 20853588.0-1020 dated Mar. 1, 2024, (24p).

* cited by examiner

DISPLAY SCREEN, TERMINAL DEVICE AND IMAGING CONTROL METHOD FOR UNDER-SCREEN CAMERA

CROSS-REFERENCE TO RELATED APPLICATION

This application is a national phase application based on PCT/CN2020/091663, filed May 21, 2020, the content of which is incorporated herein by reference in its entirety for all purposes.

TECHNICAL FIELD

The present disclosure relates to the field of smart terminal devices, and in particular to a display screen, a terminal device, and an imaging control method for an under-screen camera.

BACKGROUND

A main difference between an under-screen camera and a traditional mobile phone camera is an influence of a screen on an imaging system. Although in a current design, pixels in a corresponding area of the screen will remain closed when a camera is shooting, the pixels of the screen itself, a control circuit and related traces still have a significant influence on camera imaging. In addition to an obvious drop in transmittance, the pixels and traces arranged regularly with a spacing of 10 μm or even 1 μm will act as a two-dimensional grating structure, which may have a strong diffraction effect on external light entering the camera, leading to a diffraction image appearing on a final imaging picture, which reduces imaging quality of the under-screen camera.

SUMMARY

In order to overcome problems in the related art, the present disclosure provides a display screen, a terminal device, and a method for generating a diffraction compensation pattern.

According to a first aspect of the present disclosure, there is provided a display screen including a transparent substrate and a diffraction compensation pattern. An upper surface of the transparent substrate comprises a luminescent material. The diffraction compensation pattern is disposed below the transparent substrate and configured to compensate a diffraction image resulted from incident light passing through the luminescent material.

According to a second aspect of the present disclosure, there is provided a terminal device, including: a display screen according to the first aspect, configured to display an image; and an under-screen camera, disposed behind the display screen and configured to collect incident light passing through the display screen.

According to a third aspect of the present disclosure, there is provided an imaging control method for an under-screen camera, applied to the terminal device according to the second aspect, and the method includes: determining a pattern style of the diffraction compensation pattern; based on the pattern style of the diffraction compensation pattern, generating the diffraction compensation pattern below the transparent substrate; based on the diffraction compensation pattern, performing imaging control for the under-screen camera.

According to a fourth aspect of the present disclosure, there is provided an imaging control apparatus for an under-screen camera, applied to the terminal device according to the second aspect, and the apparatus includes: a processor and a memory for storing instructions executable by the processor. The processor is configured to: determine a pattern style of a diffraction compensation pattern, wherein a terminal device comprises a display screen and the under-screen camera disposed behind the display screen and configured to collect incident light passing through the display screen, the display screen comprises a transparent substrate and the diffraction compensation pattern, an upper surface of the transparent substrate comprises a luminescent material, and the diffraction compensation pattern is disposed below the transparent substrate and configured to compensate a diffraction image resulted from incident light passing through the luminescent material; generate the diffraction compensation pattern below the transparent substrate based on the pattern style of the diffraction compensation pattern; and perform imaging control for the under-screen camera based on the diffraction compensation pattern.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show embodiments of the present disclosure. The drawings along with the specification explain the principles of the present disclosure.

DETAILED DESCRIPTION

Figure 1:
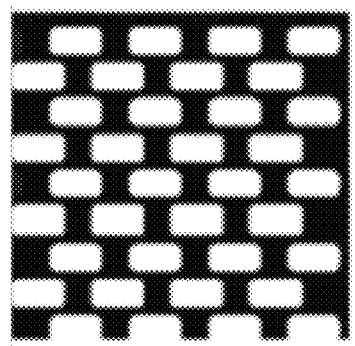
FIG. 1 is a partial schematic diagram showing a pixel arrangement of a screen according to an embodiment.

Embodiments will be described in detail herein, examples of which are illustrated in the accompanying drawings. When the following description refers to the drawings, unless otherwise indicated, the same numbers in different drawings indicate the same or similar elements. The implementations described in the following embodiments do not represent all implementations consistent with the present disclosure. Instead, they are merely examples of apparatuses and methods consistent with aspects of the present disclosure as detailed in the appended claims.

It should be noted that although expressions such as "first" and "second" are used herein to describe different modules, steps, and data of embodiments of the present disclosure, the expressions such as "first" and "second" are only for distinguishing between different modules, steps and data, but do not indicate a specific order or degree of importance. In fact, expressions such as "first" and "second" can be used interchangeably.

In order to solve the problems in the related art, the embodiments of the present disclosure provide a display screen 10, which can be an OLED (Organic Light-Emitting Diode) screen, and can be a rigid OLED screen or a flexible OLED screen. An under-screen camera may be disposed under the display screen 10, and configured to collect incident light passing through the display screen 10, which can improve the image acquisition quality in terminal devices such as a full-screen mobile phone. The display screen 10 may include: a transparent substrate 11 having an upper surface 19 that includes a luminescent material 111; a diffraction compensation pattern 12, disposed below the transparent substrate 11, and configured to compensate a diffraction image resulted from incident light passing through the luminescent material 111. By the diffraction compensation pattern 12 disposed below the transparent substrate 11, the influence of the diffraction image on the imaging of the under-screen camera is eliminated or reduced. The transparent substrate 11 may belong to an AMOLED (Active-matrix organic light-emitting diode) layer, and the AMOLED layer may also include an encapsulation layer (En-cap) 18 disposed above the transparent substrate 11. The encapsulation layer 18 can completely cover the area where the luminescent material 111 is formed on the upper surface of the transparent substrate 11, which is used for blocking air, moisture, and the like, and for ensuring the in and out of light. In one example, the full upper surface 19 of the transparent substrate 11 is formed with the luminescent material 111.

FIG. 1 shows a partial schematic diagram of a typical pixel arrangement of a screen. The black area in the figure is an area where the sub-pixels (including R, G, B) and the traces are located, and the white area is a light transmission area without pixels and traces. The spacing of each white area is in the order of 1 μm, which is determined by the pixel density (Pixels Per Inch, PPI) of the display screen. Thus, the display screen is a two-dimensional grating structure as for the imaging system of the under-screen camera 20, and there will be multi-slit Fraunhofer diffraction in two directions.

Figure 2:
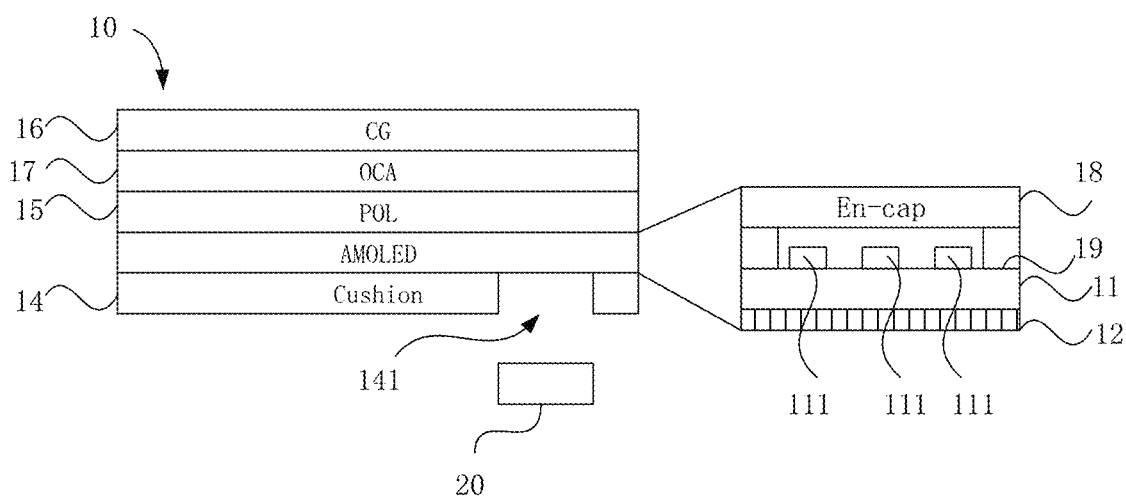
FIG. 2 is a schematic diagram showing a display screen according to an embodiment.

In an embodiment, as shown in FIG. 2, the diffraction compensation pattern 12 may be disposed on a lower surface of the transparent substrate 11. An upper surface of the transparent substrate 11 comprises a luminescent material 111, that is, elements such as sub-pixels and wiring form the diffraction compensation pattern 12 on the lower surface of the transparent substrate 11. This embodiment can be applied to a rigid OLED display screen. When applied to the rigid OLED display screen, the transparent substrate 11 may be a glass substrate, an upper surface of which is evaporated with a luminescent material 111, and in this case, the encapsulation layer 18 may be a glass encapsulation cover plate made of glass. This embodiment can also be applied to a flexible OLED display screen. When applied to the flexible OLED display screen, the transparent substrate 11 can be a PI (Polyimide) substrate, an upper surface of which is evaporated with the luminescent material 111, and in this case, the encapsulation layer 18 may be a thin film encapsulation (TFE) layer disposed on the transparent substrate 11 by deposition. Since the diffraction compensation pattern 12 is directly disposed on the lower surface of the transparent substrate 11, the position between the diffraction compensation pattern 12 and the luminescent material 111 is easy to control, no separate components are used, and subsequent assembly is not required, which greatly reduces the additional assembly and alignment risks that the compensation scheme may bring, and improves stability and yield of the system.

Figure 3:
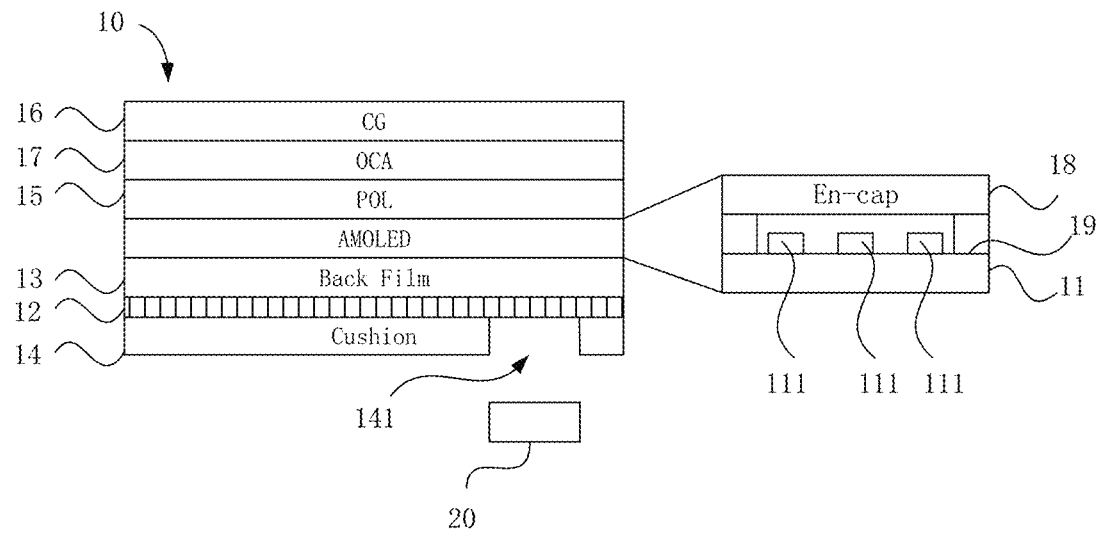
FIG. 3 is a schematic diagram showing another display screen according to an embodiment.

In another embodiment, as shown in FIG. 3, the display screen 10 may further include a back film 13 attached to the lower surface of the transparent substrate 11. The back film 13 may comprise a transparent support film. The diffraction compensation pattern 12 may be disposed on the upper surface and/or the lower surface of the transparent support film 13. This embodiment may be applied to the flexible OLED display screen. In the flexible OLED display screen, the transparent substrate 11 may be a PI (Polyimide) substrate, an upper surface of which is evaporated with the luminescent material 111. In addition, in order to protect the PI substrate, the transparent support film 13 is disposed on the lower side, which is usually a PET (polyethylene terephthalate) material. The diffraction compensation pattern 12 can be disposed on the upper surface or the lower surface of the transparent support film 13. In some embodiments, the diffraction compensation pattern 12 can be disposed on the upper surface and the lower surface of the transparent support film 13 at the same time. Similar to the foregoing embodiments, in this embodiment, by disposing the diffraction compensation pattern 12 on the transparent support film 13, the influence of the diffraction image on the imaging of the under-screen camera 20 may also be eliminated or reduced, and no separate components are used, and subsequent assembly is not required.

In an embodiment, the diffraction compensation pattern is a convex and/or concave pattern formed by etching or impressing. The aforementioned diffraction compensation pattern 12 disposed on, for example, a glass substrate or a PI substrate or a transparent support film 13 can be formed by etching, impressing, and the like, so as to form a convex pattern or a concave pattern on the surface of the transparent material, or form both a convex pattern and a concave pattern on the surface of the transparent material, to affect a light path, and to eliminate or weaken the influence of the luminescent material 11 on the incident light.

As shown in FIGS. 2 and 3, the display screen 10 may further include a cushion 14 located below the transparent substrate 11, and a region thereof corresponding to the diffraction compensation pattern 12 is provided with a through hole 141. The cushion 14 disposed on the bottom layer of the OLED display screen 10 is generally an opaque material. In order to meet the requirements of the full screen, the through hole 141 needs to be provided on the cushion 14, so that the incident light can enter the under-screen camera 20.

As shown in FIGS. 2 and 3, the display screen 10 may further include: a polarizer (POL) 15 disposed above the transparent substrate 11; a cover glass (CG) 16 attached to an upper side of the polarizer 15 by an optically clear adhesive (OCA) 17.

In an embodiment, the pattern style of the diffraction compensation pattern 12 can be determined by the following manner: based on arrangement parameters of the luminescent material 111, a distance between the transparent substrate 11 and an under-screen camera 20, and parameters of the under-screen camera 20, obtaining diffraction image parameters; and based on the diffraction image parameters, determining the pattern style of the diffraction compensation pattern 12. In this embodiment, according to the known parameters, the parameters of the diffraction image resulted from the incident light passing through the luminescent material 111 are first obtained, and then based on the diffraction image, the backward inference is performed to obtain the pattern style of the diffraction compensation image 12, that is, according to the diffraction image, it is determined which kind of pattern style of the diffraction compensation image 12 can compensate the diffraction image. Through the backward inference, the configuration that the diffraction compensation image 12 should be set to can be accurately obtained according to the known parameters. Among the known parameters, the arrangement parameters of the luminescent material 111 may include: a pixel size in a length direction of the display screen 10, a spacing size between adjacent pixels in the length direction of the display screen 10, a pixel size in a width direction of the display screen 10 and a spacing size between adjacent pixels in the width direction of the display screen 10. The parameters of the under-screen camera 20 may include: a focal length of the under-screen camera 20, and a distance between a sensor and a lens of the under-screen camera 20. Due to the pixel arrangement of the luminescent material 111, as shown in FIG. 1, it can be regarded as a two-dimensional grating, that is, gratings are formed in both the length direction and the width direction of the display screen 10. The incident light can be considered as parallel light.

One dimension is taken as an example, and the two dimensions mean superposition in two directions. For example, in the length direction of the display screen 10, the width a and the distance d of the light transmission area can be determined based on the pixel arrangement parameters of the display screen 10. Since the pixels are arranged on the transparent substrate 11, the pixels themselves do not transmit light, and the space between the pixels can transmit light, the width a of the light transmission area is a spacing size between adjacent pixels in the length direction of the display screen 10, and the distance d of the light transmission area is the pixel size in the length direction of the display screen 10; the distance l between the display screen 10 and the under-screen camera 20 can be a distance between the transparent substrate 11 and the under-screen camera 20; the focal length of the lens of the under-screen camera 20 and the distance x from the lens to the sensor are known. Relative to the display screen 10, the external light can be simplified as parallel incident light, and the light intensity of a certain external point S on the camera sensor pixel P after being diffracted by the display screen 10 can be expressed as:

$$I(P) = I_0 \left( \frac{\sin\alpha}{\alpha} \right)^2 \left( \frac{\sin\frac{N}{2}\delta}{\sin\frac{\delta}{2}} \right)^2$$

where $I_0$ is light intensity of S at a center of diffraction under single slit diffraction, $$\alpha = \frac{\pi}{\lambda} a \sin\theta, \delta = \frac{2\pi}{\lambda} d \sin\theta, \sin\theta = \frac{\pi}{f},$$

and λ represents corresponding light wavelength.

In the imaging process, the influence of each optical device on the incident light can be expressed as convolution of a device-related transmission function on the incident light function. Therefore, the light-emitting element 111 of the display screen 10 also corresponds to a transmission function. After modeling the display screen 10, a compensation function corresponding to the diffraction compensation pattern at a determined position can be calculated by deconvolution according to the distance between respective element devices, and the pattern design is performed based on the compensation function. The principle is the same as the derivation of the screen transmission function based on the screen parameters, which can compensate for the diffraction of the light-emitting element 111 of the display screen 10 and optimize the imaging quality of the under-screen camera 20.

Based on the same inventive concept, the present disclosure also provides a terminal device. The terminal device may be a mobile phone, a tablet computer, and the like, especially a device with the full screen. The terminal device may include: the display screen 10 as in any one of the foregoing embodiments, and configured to display an image; an under-screen camera 20, disposed behind the display screen 10 and configured to collect incident light passing through the display screen 10. By the diffraction compensation pattern 12, the diffraction image resulted from the incident light passing through the luminescent material 111 can be compensated, and then the influence of the diffraction image on the imaging of the under-screen camera 20 can be eliminated or reduced, thereby improving the imaging quality of the under-screen camera 20. In addition, the pattern is disposed directly on the original components of the display screen 10, and the distance to the screen traces and the luminescent material layer is relatively controllable, and no subsequent assembly is required, which greatly reduces the additional assembly and alignment risks that the compensation scheme may bring, and improves stability and yield of a system.

Based on the same inventive concept, the present disclosure also provides an imaging control method 100 for an under-screen camera, which can be applied to the terminal device of the foregoing embodiments. The method includes: determining a pattern style of the diffraction compensation pattern; based on the pattern style of the diffraction compensation pattern, generating the diffraction compensation pattern below the transparent substrate; based on the diffraction compensation pattern, performing imaging control for the under-screen camera.

The pattern style of the diffraction compensation pattern can be determined by the following manner: analyzing the imaging effect of the under-screen camera without diffraction compensation to obtain an analysis result, and the analysis result at least includes diffraction image parameters; based on the analysis result, the imaging parameters that can eliminate or weaken the diffraction image to a preset degree are determined; and the pattern style of the diffraction compensation pattern is determined based on the imaging parameters.

Figure 4:
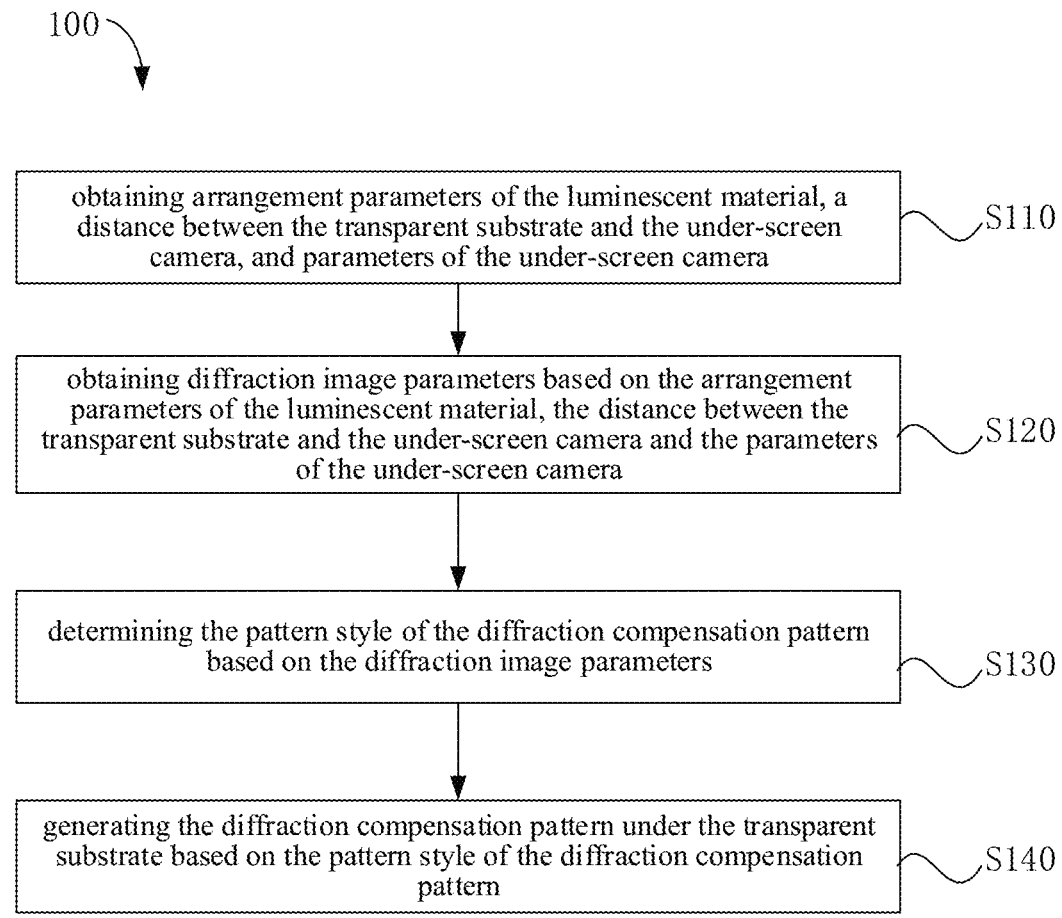
FIG. 4 shows a schematic flowchart of a method for generating a diffraction compensation pattern according to an embodiment of the present disclosure.

In one or more embodiments, as shown in FIG. 4, the imaging control method 100 for the under-screen camera may include: in step S110, arrangement parameters of the luminescent material, a distance between the transparent substrate and the under-screen camera, and parameters of the under-screen camera are obtained; in step S120, based on the arrangement parameters of the luminescent material, the distance between the transparent substrate and the under-screen camera, and the parameters of the under-screen camera, diffraction image parameters are obtained; in step S130, based on the diffraction image parameters, the pattern style of the diffraction compensation pattern is determined; and in step S140, based on the pattern style of the diffraction compensation pattern, the diffraction compensation pattern is generated below the transparent substrate. The diffraction compensation pattern with the convex and/or concave pattern can be generated below the transparent substrate by etching or impressing.

In an embodiment, the arrangement parameters of the luminescent material include: a pixel size in a length direction of the display screen, a spacing size between adjacent pixels in the length direction of the display screen, a pixel size in a width direction of the display screen and a spacing size between adjacent pixels in the width direction of the display screen; and/or, the parameters of the under-screen camera include: a focal length of the under-screen camera, and a distance between a sensor and a lens of the under-screen camera.

Through the imaging control method for the under-screen camera of the above embodiments, it is possible to generate the diffraction compensation pattern with a specific configuration without adding the elements of the display screen 10, thereby canceling the diffraction effect of the luminescent material 111 in the display screen 10 on the incident light, and ensuring the imaging quality of the under-screen camera 20.

Based on the same inventive concept, the present disclosure also provides an imaging control apparatus for an under-screen camera, applied to the terminal device according to the second aspect, and the apparatus includes: a determination module, configured to determine a pattern style of the diffraction compensation pattern; a generation module, configured to generate the diffraction compensation pattern below the transparent substrate based on the pattern style of the diffraction compensation pattern; and a control module, configured to perform imaging control for the under-screen camera based on the diffraction compensation pattern.

Through the imaging control apparatus for the under-screen camera of the above embodiments, it is possible to generate the diffraction compensation pattern with a specific configuration without adding display screen elements, thereby canceling the diffraction effect of the luminescent material in the display screen on the incident light, and ensuring the imaging quality of the under-screen camera.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are only illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A display screen, comprising:
   a transparent substrate, wherein an upper surface of the transparent substrate comprises a luminescent material; and
   a diffraction compensation pattern, disposed below the transparent substrate, and configured to compensate a diffraction image resulted from incident light passing through the luminescent material,
   wherein the display screen further comprises:
   a transparent support film, attached to a lower surface of the transparent substrate,
   wherein the diffraction compensation pattern is disposed on a lower surface of the transparent support film.

2. The display screen according to claim 1, wherein the diffraction compensation pattern is disposed on a lower surface of the transparent substrate.

3. The display screen according to claim 1, wherein the diffraction compensation pattern comprises at least one of following patterns:
   a convex pattern and a concave pattern formed by etching or impressing.

4. The display screen according to claim 1, wherein a pattern style of the diffraction compensation pattern is determined by:
   obtaining diffraction image parameters based on arrangement parameters of the luminescent material, a distance between the transparent substrate and an under-screen camera, and parameters of the under-screen camera; and
   determining the pattern style of the diffraction compensation pattern based on the diffraction image parameters.

5. The display screen according to claim 4, wherein:
   the arrangement parameters of the luminescent material comprise: a pixel size in a length direction of the display screen, a spacing size between adjacent pixels in the length direction of the display screen, a pixel size in a width direction of the display screen, and a spacing size between adjacent pixels in the width direction of the display screen; and
   the parameters of the under-screen camera comprise: a focal length of the under-screen camera, and a distance between a sensor and a lens of the under-screen camera.

6. The display screen according to claim 1, further comprising:
   a cushion, located below the transparent substrate, wherein a region of the cushion corresponding to the diffraction compensation pattern is provided with a through hole.

7. The display screen according to claim 1, further comprising:
   a polarizer, disposed above the transparent substrate; and
   a glass cover plate, attached to an upper side of the polarizer by an optically clear adhesive.

8. A terminal device, comprising:
   a display screen comprising:
      a transparent substrate, wherein an upper surface of the transparent substrate comprises a luminescent material; and
      a diffraction compensation pattern, disposed below the transparent substrate, and configured to compensate a diffraction image resulted from incident light passing through the luminescent material; and
   an under-screen camera, disposed behind the display screen and configured to collect incident light passing through the display screen,
   wherein the display screen further comprises:
   a transparent support film, attached to a lower surface of the transparent substrate,
   wherein the diffraction compensation pattern is disposed on a lower surface of the transparent support film.

9. An imaging control method for an under-screen camera, comprising:
   determining, by a terminal device, a pattern style of a diffraction compensation pattern, wherein the terminal device comprises a display screen and the under-screen camera disposed behind the display screen and configured to collect incident light passing through the display screen, the display screen comprises a transparent substrate and the diffraction compensation pattern, an upper surface of the transparent substrate comprises a luminescent material, and the diffraction compensation pattern is disposed below the transparent substrate and configured to compensate a diffraction image resulted from incident light passing through the luminescent material, wherein the display screen further comprises:
a transparent support film, attached to a lower surface of the transparent substrate, the diffraction compensation pattern is disposed on a lower surface of the transparent support film;
generating, by the terminal device, the diffraction compensation pattern below the transparent substrate based on the pattern style of the diffraction compensation pattern; and
performing, by the terminal device, imaging control for the under-screen camera based on the diffraction compensation pattern.

10. The imaging control method for the under-screen camera according to claim 9, wherein determining, by the terminal device, the pattern style of the diffraction compensation pattern comprises:
obtaining arrangement parameters of the luminescent material, a distance between the transparent substrate and the under-screen camera, and parameters of the under-screen camera;
obtaining diffraction image parameters based on the arrangement parameters of the luminescent material, the distance between the transparent substrate and the under-screen camera, and the parameters of the under-screen camera; and
determining the pattern style of the diffraction compensation pattern based on the diffraction image parameters.

11. The imaging control method for the under-screen camera according to claim 10, wherein:

the arrangement parameters of the luminescent material comprise: a pixel size in a length direction of the display screen, a spacing size between adjacent pixels in the length direction of the display screen, a pixel size in a width direction of the display screen, and a spacing size between adjacent pixels in the width direction of the display screen; and
the parameters of the under-screen camera comprise: a focal length of the under-screen camera, and a distance between a sensor and a lens of the under-screen camera.

12. An imaging control apparatus for an under-screen camera, comprising:
a processor; and
a memory for storing instructions executable by the processor,
wherein the processor is configured to:
determine a pattern style of a diffraction compensation pattern, wherein a terminal device comprises a display screen and the under-screen camera disposed behind the display screen and configured to collect incident light passing through the display screen, the display screen comprises a transparent substrate and the diffraction compensation pattern, an upper surface of the transparent substrate comprises a luminescent material, and the diffraction compensation pattern is disposed below the transparent substrate and configured to compensate a diffraction image resulted from incident light passing through the luminescent material;
generate the diffraction compensation pattern below the transparent substrate based on the pattern style of the diffraction compensation pattern; and
perform imaging control for the under-screen camera based on the diffraction compensation pattern.

* * * * *